(12) United States Patent
Shin et al.

(10) Patent No.: US 8,455,122 B2
(45) Date of Patent: Jun. 4, 2013

(54) VOLTAGE SENSING ASSEMBLY FOR BATTERY MODULE AND BATTERY MODULE EMPLOYED WITH THE SAME

(75) Inventors: Yong Shik Shin, Daejeon (KR); Jong Moon Yoon, Daejeon (KR); JaeHun Yang, Daejeon (KR); Jin Kyu Lee, Daejeon (KR); BumHyun Lee, Seoul (KR); DalMo Kang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/523,361

(22) Filed: Jun. 14, 2012

(65) Prior Publication Data

US 2012/0315522 A1 Dec. 13, 2012

Related U.S. Application Data

(63) Continuation of application No. PCT/KR2011/002437, filed on Apr. 7, 2011.

(30) Foreign Application Priority Data

Apr. 8, 2010 (KR) .......................... 10-2010-0032105

(51) Int. Cl.
*H01M 2/00* (2006.01)
(52) U.S. Cl.
USPC ..................... 429/61; 429/65; 429/90; 429/93
(58) Field of Classification Search
USPC .......................................... 429/61, 65, 90, 93
See application file for complete search history.

(56) References Cited

U.S. PATENT DOCUMENTS

| | | | |
|---|---|---|---|
| 2009/0214936 A1* | 8/2009 | Yang et al. | 429/61 |
| 2009/0325043 A1 | 12/2009 | Yoon et al. | |
| 2010/0151299 A1 | 6/2010 | Ha et al. | |

FOREIGN PATENT DOCUMENTS

| | | |
|---|---|---|
| KR | 10-2007-0110565 A | 11/2007 |
| KR | 10-2007-0114409 A | 12/2007 |
| KR | 10-2008-0025429 A | 3/2008 |
| KR | 10-2008-0038467 A | 5/2008 |

* cited by examiner

*Primary Examiner* — Jane Rhee
(74) *Attorney, Agent, or Firm* — Birch, Stewart, Kolasch & Birch, LLP

(57) ABSTRACT

Disclosed is a voltage sensing assembly for a battery module to sense voltage of battery cells having electrode terminals formed at the upper or lower end thereof in a state in which the voltage sensing assembly is mounted in the battery module, the voltage sensing assembly including (a) an upper and a lower block case to be coupled to each other in an assembled fashion, the upper block case and the lower block case being made of an electrically insulative material, the upper block case and the lower block case being mounted to a region (front or rear) of the battery module corresponding to electrode terminal connection parts of the battery cells, (b) upper-row and lower-row conductive sensors to be connected to the electrode terminal connection parts of the battery cells, respectively, and (c) a connector to transmit voltages sensed by the conductive sensors to a battery management system (BMS).

22 Claims, 10 Drawing Sheets

200

900

VOLTAGE SENSING ASSEMBLY FOR BATTERY MODULE AND BATTERY MODULE EMPLOYED WITH THE SAME

CROSS-REFERENCE TO RELATED APPLICATIONS

This application is a Continuation of PCT International Application No. PCT/KR2011/002437 filed on Apr. 7, 2011, which claims priority of Application No. 10-2010-0032105 filed in Korea on Apr. 8, 2010, all which are hereby expressly incorporated by reference into the present application.

TECHNICAL FIELD

The present invention relates to a voltage sensing assembly for a battery module to sense voltage of battery cells having electrode terminals formed at the upper end or the lower end thereof in a state in which the voltage sensing assembly is mounted in the battery module, the voltage sensing assembly including an upper block case, a lower block case, upper-row and lower-row conductive sensors and a connector, wherein the upper block case and the lower block case comprise mounting grooves, which are upwardly open, formed at positions corresponding to the electrode terminal connection parts, respectively, the upper-row conductive sensors are connected to upper-row electrode terminal connection parts in a state in which the upper-row conductive sensors are mounted in the mounting grooves of the upper block case, and the lower-row conductive sensors are connected to lower-row electrode terminal connection parts in a state in which the lower-row conductive sensors are mounted in the mounting groove of the lower block case.

BACKGROUND ART

Recently, a secondary battery, which can be charged and discharged, has been widely used as an energy source for wireless mobile devices. Also, the secondary battery has attracted considerable attention as a power source for electric vehicles (EV), hybrid electric vehicles (HEV) and plug-in hybrid electric vehicles (Plug-in HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, use a battery module having a plurality of battery cells electrically connected to one another because high power and large capacity are necessary for the middle or large-sized devices.

Preferably, the battery module is manufactured so as to have as small a size and weight as possible. For this reason, a prismatic battery or a pouch-shaped battery, which can be stacked with high integration and has a small weight to capacity ratio, is usually used as a battery cell of a middle or large-sized battery module. In particular, much interest is currently focused on the pouch-shaped battery, which uses an aluminum laminate sheet as a sheathing member, because the pouch-shaped battery is lightweight and the manufacturing costs of the pouch-shaped battery are low.

Also, a plurality of battery cells is combined to constitute a battery module. When overvoltage, overcurrent or overheat occurs at some of the battery cells, therefore, safety and operating efficiency of the battery module are deteriorated. For this reason, it is necessary to provide a unit to sense and control such overvoltage, overcurrent or overheat. Consequently, a voltage sensor is connected to the battery cells to confirm an operating state of the battery cells in real time or at predetermined intervals and control voltage of the battery cells. However, installation or connection of such a sensing unit complicates an assembly process of the battery module.

In addition, a short circuit may occur due to a plurality of wires used to install or connect the sensing unit. Also, as the result of wide application of secondary batteries, the secondary batteries are used as a power source for vehicles. Consequently, it is necessary to provide a fixing unit to stably maintain a contact state of the sensing unit even when strong impact or vibration is applied to the sensing unit.

On the other hand, in a case in which a plurality of battery cells is used to constitute a battery module or a plurality of unit modules, each of which includes a predetermined number of battery cells, is used to constitute a battery module, it is generally necessary to provide a large number of members to achieve mechanical coupling and electrical connection between the battery cells or the unit modules. However, a process of assembling such members is very complicated. Furthermore, it is necessary to provide a space in which the members are coupled, welded or soldered to achieve mechanical coupling and electrical connection between the battery cells or the unit modules. As a result, overall system size is increased. The increase of the size is not preferred as previously described. Consequently, there is a high necessity for a battery module which is more compact and exhibits high structural stability.

DISCLOSURE

[Technical Problem]

Therefore, the present invention has been made to solve the above problems, and other technical problems that have yet to be resolved.

Specifically, it is an object of the present invention to provide a voltage sensing assembly for battery modules that can be manufactured using a simple assembly method without using a plurality of members to achieve mechanical coupling and electrical connection.

It is another object of the present invention to provide a voltage sensing assembly which is separately provided to improve productivity of battery modules and maintenance of battery modules.

It is a further object of the present invention to provide a battery module that is manufactured to have desired power and capacity including the voltage sensing assembly for battery modules.

[Technical Solution]

In accordance with one aspect of the present invention, the above and other objects can be accomplished by the provision of a voltage sensing assembly for a battery module to sense voltage of battery cells having electrode terminals formed at the upper end or the lower end thereof in a state in which the voltage sensing assembly is mounted in the battery module, the voltage sensing assembly including (a) an upper block case and a lower block case to be coupled to each other in an assembled fashion, the upper block case and the lower block case being made of an electrically insulative material, the upper block case and the lower block case being mounted to a region (front or rear) of the battery module corresponding to electrode terminal connection parts of the battery cells, (b) upper-row and lower-row conductive sensors to be connected to the electrode terminal connection parts of the battery cells, respectively, and (c) a connector to transmit voltages sensed by the conductive sensors to a battery management system (BMS), wherein the upper block case and the lower block case comprise mounting grooves, which are upwardly open, formed at positions corresponding to the electrode terminal connection parts, respectively, the upper-row conductive sensors are connected to the upper-row electrode terminal connection parts in a state in which the upper-row conductive sensors are mounted in the mounting grooves of the upper block case, and the lower-row conductive sensors are connected to the lower-row electrode terminal connection parts in a state in which the lower-row conductive sensors are mounted in the mounting groove of the lower block case.

In the voltage sensing assembly for battery modules according to the present invention, the upper-row conductive sensors are connected to the upper-row electrode terminal connection parts in a state in which the upper-row conductive sensors are mounted in the mounting grooves of the upper block case, and the lower-row conductive sensors are connected to the lower-row electrode terminal connection parts in a state in which the lower-row conductive sensors are mounted in the mounting groove of the lower block case, and therefore, an assembly process of the voltage sensing assembly is very simple and the voltage sensing assembly has a compact structure to stably sense voltage.

Also, the member to sense voltage of the battery cells is configured to have a modular assembly structure. Consequently, the voltage sensing assembly can be easily mounted to the front or the rear of the battery module.

In addition, the assembly structure, which is configured as a separate unit, can be manufactured through outsourcing. Consequently, it is possible to greatly improve productivity of battery modules. Also, when components constituting the voltage sensing assembly malfunction, the voltage sensing assembly mounted to the front or the rear of the battery module is replaced without disassembly of the battery module, thereby greatly improving maintenance as compared with the structure of a conventional battery module.

The coupling structure between the upper block case and the lower block case is not particularly restricted so long as the upper block case and the lower block case can be easily coupled to each other. For example, the upper block case may be provided at one side of the outside thereof with a downwardly protruding coupling part, and the lower block case may be provided at the outside thereof corresponding to the coupling part with a downwardly depressed coupling groove.

Consequently, the coupling part of the upper block case is fitted in the coupling groove of the lower block case, thereby easily achieving coupling between the upper block case and the lower block case.

In another example, the upper block case may be provided at one side of the outside thereof with an upwardly depressed coupling groove, and the lower block case may be provided at the outside thereof corresponding to the coupling groove with an upwardly protruding coupling part.

The structure of mounting grooves of the upper block case and the mounting groove of the lower block case is not particularly restricted so long as the upper-row conductive sensors can be easily mounted in the mounting grooves of the upper block case and the lower-row conductive sensors can be easily mounted in the mounting groove of the lower block case. For example, the mounting grooves of the upper block case may be individually formed so as to correspond to the respective upper-row conductive sensors. Consequently, the upper-row conductive sensors can be mounted in the respective mounting grooves of the upper block case. In this case, contact between the conductive sensors is prevented, which is preferable.

In another example, the mounting groove of the lower block case may be configured in the form of a single groove in which all of the lower-row conductive sensors are mounted.

The mounting grooves may be upwardly depressed at regions facing the electrode terminal connection parts. In this case, the conductive sensors are mounted in the respective mounting grooves, and then the electrode terminal connection parts are inserted into the respective mounting grooves, thereby easily achieving electrical connection between the conductive sensors and the electrode terminal connection parts.

In a preferred example, the conductive sensors may be formed to have a receptacle type structure in which the conductive sensors are inserted into the electrode terminal connection parts from above. In this case, electrical connection between the conductive sensors and the electrode terminal connection parts is stably maintained even when external impact is applied to the battery module, which is preferable.

The structure of the conductive sensors is not particularly restricted so long as the conductive sensors can easily be connected to the connector, which transmits sensed voltage to the BMS. For example, the conductive sensors may be connected to the connector via wires and each of the wires may be wrapped with an insulating tape or may be mounted in a tubular member so that each of the wires can be isolated from the outside. The tubular member may be, for example, a hollow insulative pipe.

Preferably, the upper block case and the lower block case are provided at the fronts thereof with depressions in which the respective wires are mounted, thereby providing a compact structure. More preferably, each of the depressions is provided at the inside thereof with a plurality of protrusions formed in an alternately oriented fashion to stably fix a corresponding one of the inserted wires.

Meanwhile, the voltage sensing assembly may further include a battery cell temperature sensor to sense temperatures of the battery cells and/or a coolant temperature sensor to measure temperature of a coolant in a coolant introduction part. In this case, it is possible to sense and control excessive increase of temperature, thereby effectively preventing the battery modules from catching fire or exploding.

In accordance with another aspect of the present invention, there is provided a battery module having the voltage sensing assembly with the above-stated construction.

In a preferred example, the battery module may include (a) a battery cell stack having a plurality of battery cells or unit modules connected in series to each other in a state in which the battery cells or unit modules are stacked in the lateral direction, the battery cell stack being provided at the front thereof with bus bars to connect electrode terminals of the battery cells to external input and output terminals, (b) an upper case to cover the end of one side of the battery cell stack and portions of the top and bottom of the battery cell stack, the upper case being provided at the front thereof with external input and output terminals, the upper part of the voltage sensing assembly being mounted in the upper case, and (c) a lower case coupled to the upper case in a state in which the lower case covers the end of the other side of the battery cell stack and the remaining portions of the top and bottom of the battery cell stack, the lower part of the voltage sensing assembly being mounted in the lower case.

For reference, at least some of the electrical connection portions of the battery cells are connected in series to each other in a unit module or at least some of the electrical connection portions of the battery cells in one unit module are connected in series to at least some of the electrical connection portions of the battery cells in another unit module. The electrode terminals of the battery cells are coupled to each other in a state in which the battery cells are arranged so that the electrode terminals of the battery cells are adjacent to each other, and a predetermined number of the battery cells are covered by cell covers to manufacture a plurality of unit modules. A sequence of the manufacturing process may be partially changed. For example, a plurality of unit modules may be individually manufactured and electrical connection between the unit modules may be performed.

The battery cell stack, in which the battery cells are stacked with high integration in a state in which the electrode terminals of the battery cells are connected to each other, is mounted in the upper and lower cases, which can be vertically separated and are coupled to each other in an assembly type coupling structure, in the vertical direction.

When the battery cell stack is mounted in the upper and lower cases and the upper and lower cases are coupled to each other, the upper and lower cases cover only the edge of the battery cell stack so that opposite major surfaces of the battery cell stack are exposed to the outsides of the upper and lower cases to easily dissipate heat from the battery cell stack. As previously described, therefore, the upper case covers the end of one side of the battery cell stack and portions of the top and bottom of the battery cell stack, and the lower case covers the end of the other side of the battery cell stack and the remaining portions of the top and bottom of the battery cell stack.

In a battery module constituted by a plurality of battery cells, on the other hand, it is necessary to measure and control voltage in consideration of safety and operating efficiency of the battery module. In particular, it is necessary to measure voltage for each battery cell or for each electrical connection part of the battery cells. However, the installation of such voltage sensing members further complicates the structure of the battery module.

In the battery module according to the present invention, the voltage sensing assembly is mounted inside the front of the upper case and the lower case which are coupled to each other, thereby solving the above-mentioned problem. That is, the battery module is configured so that the voltage sensing assembly is mounted inside the front of the upper case and the lower case which are coupled to each other.

Since the voltage sensing assembly is configured to have a modular structure and is mounted inside the front of the upper case and the lower case which are coupled to each other, the voltage sensing members have a more compact structure as compared with the structure of a conventional battery module in which the voltage sensing members are mounted inside the front and the rear of the lower case and are connected to each other via a wire disposed at the lower part of the lower case.

The battery cell stack may include a plurality of unit modules including plate-shaped battery cells, each of which has electrode terminals formed at the upper or lower end thereof. Each of the unit modules may include two or more battery cells arranged in a stacked structure in a state in which electrode terminals of the battery cells are connected in series to each other and a pair of cell covers coupled to each other so as to cover the entirety of the outside of the battery cell stack excluding the electrode terminals of the battery cells.

In a preferred example of the above structure, electrode terminals, which are connected in series to each other, of battery cells disposed adjacent to each other in a unit module may be disposed in tight contact with each other in a state in which the electrode terminals face each other to constitute an electrode terminal connection part.

In another preferred example, electrode terminals, which are connected in series to each other, of battery cells disposed in different unit modules so that the battery cells are adjacent to each other may be disposed in tight contact with each other in a state in which the electrode terminals are perpendicularly bent to constitute a perpendicular electrode terminal connection part.

The upper case may be provided at the front thereof with a pair of slits, through which the bus bars connected to the outermost electrode terminals of the battery cell stack are inserted. Consequently, it is possible to easily mount the bus bars to the upper case.

Each of the bus bars may include an electrode terminal connection part electrically connected to a corresponding one of the outermost electrode terminals of the battery module and an input and output terminal connection part connected to a corresponding one of the external input and output terminals of the upper case. Also, the input and output terminal connection part may be perpendicularly bent from the electrode terminal connection part inwardly of the battery module.

Consequently, the bus bars with the above-stated construction may simultaneously connect the outermost electrode terminals of the battery module and the external input and output terminals of the upper case to each other, which is preferable.

In the above structure, the input and output terminal connection part of each of the bus bars may be provided at the upper part thereof with an inwardly depressed region, and each of the external input and output terminals may be fitted in the depressed region, thereby achieving electrical connection between each of the external input and output terminals and a corresponding one of the bus bars.

Consequently, it is possible to effectively prevent the bus bars from being dislocated after the bus bars are electrically connected to the external input and output terminals.

Meanwhile, the battery module may further include a temperature sensor to sense and control temperature of the battery cells or a coolant introduction part in addition to the voltage sensing assembly to sense voltage to prevent the battery module from catching fire or exploding and thus to improve safety of the battery module.

In an example of the above structure, therefore, the battery module may further include a battery cell temperature sensor, and the battery cell temperature sensor may be located at the middle region of the battery module to easily sense temperature of the middle region of the battery module, at which temperature is highest.

In another example of the above structure, the battery module may further include a coolant temperature sensor, and the coolant temperature sensor may be located at an outermost side of the battery module to easily sense temperature of a coolant introduction part located at the outermost side of the battery module.

Generally, the battery module is configured to have a structure in which a coolant flows in the battery module to cool the battery module. In this case, the cooling efficiency of the battery module is dependent upon the temperature of the coolant introduction part, and therefore, it is important to measure the temperature of the coolant introduction part. Consequently, the installation structure of the coolant temperature sensor as described above is very preferable in improving safety of the battery module.

The battery module according to the present invention is generally configured to have a compact structure. Also, structurally stable mechanical coupling and electrical connection are achieved without using a large number of members. In addition, a predetermined number, such as 4, 6, 8 or 10, of battery cells or unit modules constitute a battery module. Consequently, it is possible to effectively install a necessary number of battery modules in a limited space.

In accordance with a further aspect of the present invention, therefore, there is provided a high power and capacity middle or large-sized battery pack manufactured using the battery module with the above-stated construction as a unit module.

The middle or large-sized battery pack according to the present invention may be manufactured by combining battery modules based on desired power and capacity. Also, the middle or large-sized battery pack according to the present invention is preferably used as a power source for electric vehicles, hybrid electric vehicles or plug-in hybrid electric vehicles, which have a limited installation space and are exposed to frequent vibration and strong impact in consideration of installation efficiency and structural stability as previously described.

ADVANTAGEOUS EFFECTS

As is apparent from the above description, the voltage sensing assembly for battery modules according to the present invention can be manufactured using a simple assembly method without using a plurality of members to achieve mechanical coupling and electrical connection. Consequently, it is possible to reduce manufacturing cost of the voltage sensing assembly. Also, it is possible to stably sense voltage even when strong external impact or vibration is applied to the voltage sensing assembly.

Also, the voltage sensing assembly according to the present invention can be separately provided, thereby greatly improving productivity of battery modules and maintenance of battery modules.

In addition, the battery module including the voltage sensing assembly according to the present invention can be used as a unit module to manufacture a middle or large-sized battery pack having desired power and capacity.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings. It should be noted, however, that the scope of the present invention is not limited by the illustrated embodiments.

Figure 1:
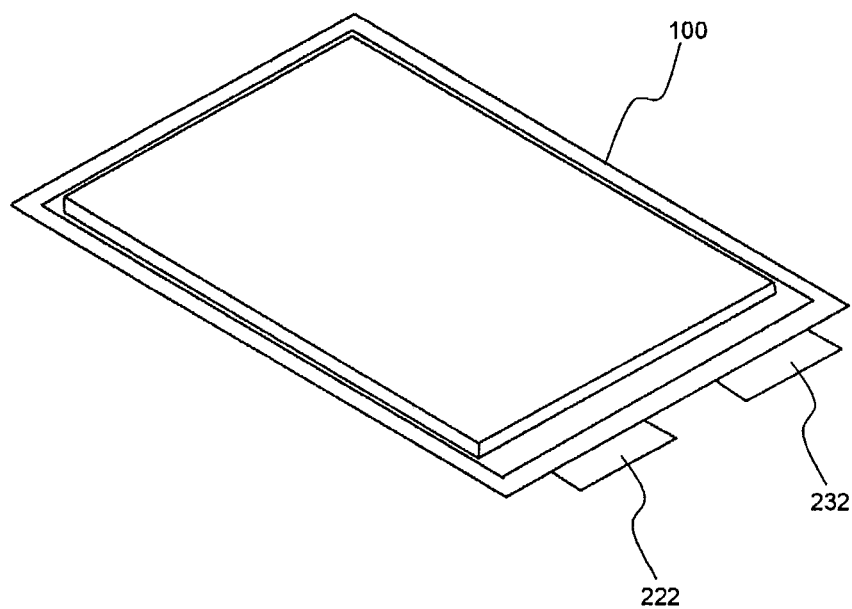
FIG. 1 is a perspective view of a battery cell, which will be mounted in a battery module.
Figure 2:
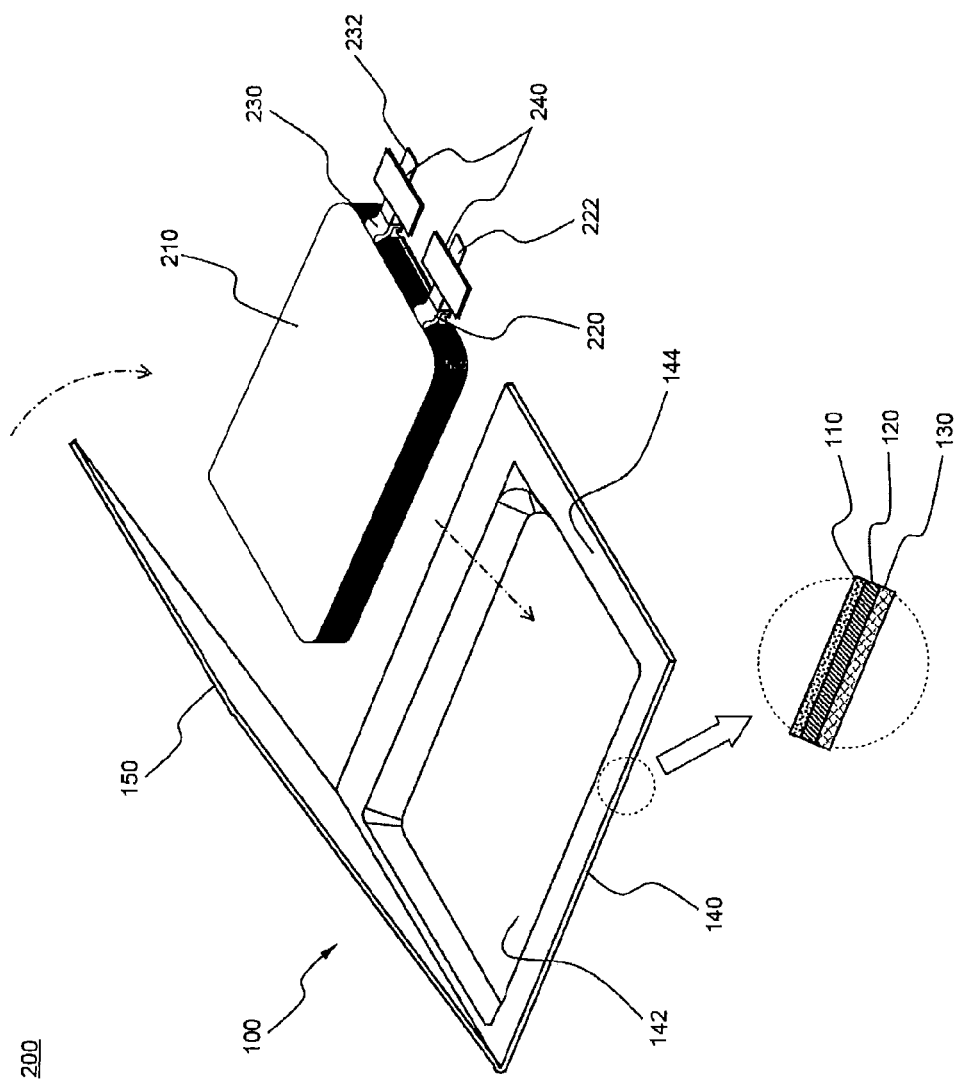
FIG. 2 is a typical exploded view of FIG. 1.

FIG. 1 is a perspective view typically illustrating an exemplary battery cell, which will be mounted in a unit module according to the present invention, and FIG. 2 is a typical exploded view of FIG. 1.

Referring to these drawings, a pouch-shaped battery cell 200 is configured to have a structure in which an electrode assembly 210, including cathodes, anodes and separators disposed respectively between the cathodes and the anodes, is mounted in a pouch-shaped battery case 100 in a sealed state so that two electrode leads 222 and 232 electrically connected to cathode and anode tabs 220 and 230 of the electrode assembly are exposed to the outside.

The battery case 100 includes a case body 140 having a depressed receiving part 142, in which the electrode assembly 210 is located, and a cover 150 integrally connected to the case body 140.

The cathode tabs 220 and the anode tabs 230 of the electrode assembly 210, which is configured to have a stack type or stack/folding type structure, are coupled to the electrode leads 222 and 232, respectively, by welding. Also, insulative films 240 are attached to the top and bottom of each of the electrode leads 222 and 232 to prevent the occurrence of a short circuit between a thermal wending device and the electrode leads 222 and 232 and to achieve sealing between the electrode leads 222 and 232 and the battery case 100 when the cover 150 is thermally welded to a surplus portion 144 of the case body 140 using the thermal welding device.

The case body 140 includes an outer resin layer 110, an isolation metal layer 120 and an inner resin layer 130. Similarly, the cover 150 includes an outer resin layer 110, an isolation metal layer 120 and an inner resin layer 130. The inner resin layer 130 of the cover 150 is fixed to inner resin layer 130 of the case body 140 in a tight contact state by heat and pressure generated from the thermal welding device (not shown) applied to the outside of the case body 140 and to the outside of the cover 150.

Contact regions between the surplus portion 144 of the case body 140 and the cover 150 are thermally welded in a state in which the electrode terminal 210, which is impregnated with an electrolyte, is located in the receiving part 142 to form a sealing part.

Figure 3:
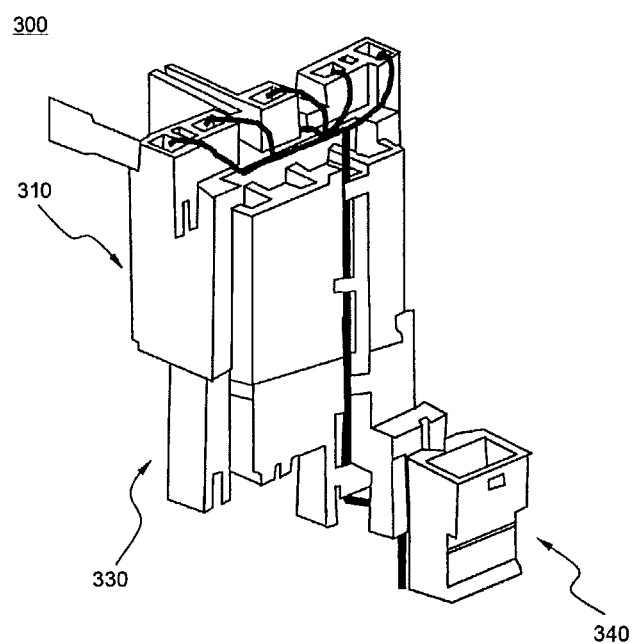
FIG. 3 is a perspective view of a voltage sensing assembly according to an embodiment of the present invention.
Figure 4:
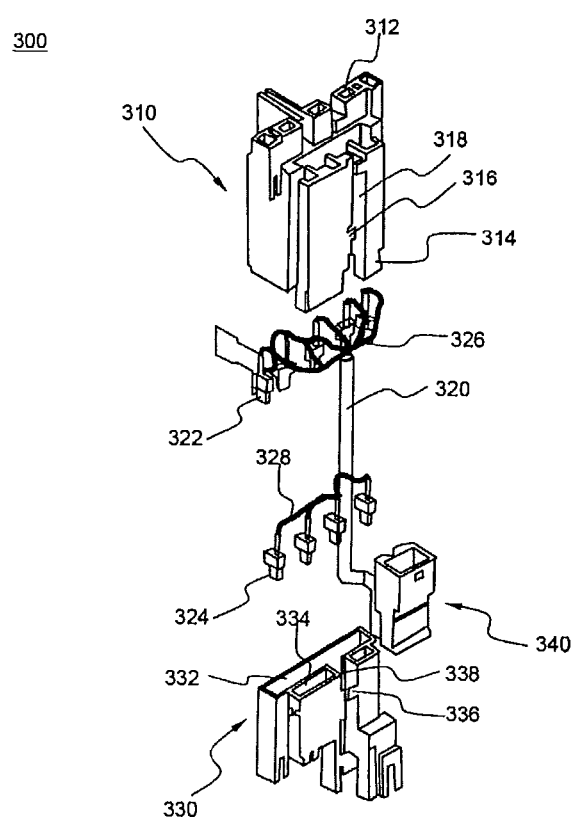
FIG. 4 is a typical exploded view of the voltage sensing assembly of FIG. 3.

FIG. 3 is a perspective view typically illustrating a voltage sensing assembly according to an embodiment of the present invention, and FIG. 4 is a typical exploded view of the voltage sensing assembly of FIG. 3.

Figure 7:
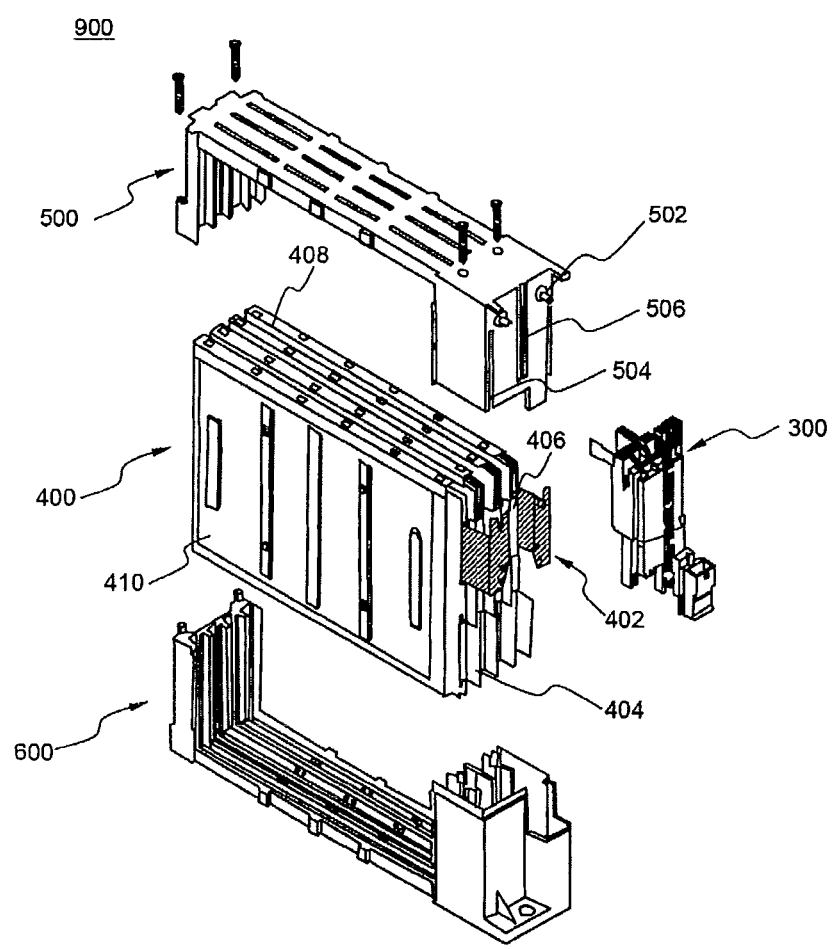
FIG. 7 is a typical exploded view of the battery module of FIG. 6.

Referring to these drawings together with FIG. 7, a voltage sensing assembly 300 includes an upper block case 310, a lower block case 330, upper-row and lower-row conductive sensors 322 and 324 connected to electrode terminal connection parts 406 and 404 (see FIG. 7) of battery cells, respectively, and a connector 340 to transmit voltages sensed by the conductive sensors to a battery management system (BMS).

The upper block case 310 and the lower block case 330 are coupled to each other in an assembled fashion. The upper block case 310 and the lower block case 330 are made of an electrically insulative material. The upper block case 310 and the lower block case 330 are mounted to the front of a battery module 900 corresponding to the electrode terminal connection parts 406 and 404 of the battery cells, respectively.

Also, the upper block case 310 and the lower block case 330 include mounting grooves 312 and 332, which are upwardly open, formed at positions corresponding to the electrode terminal connection parts 406 and 404, respectively.

The upper block case 310 is provided at one side of the outside thereof with a downwardly protruding coupling part 314. The lower block case 330 is provided at the outside thereof corresponding to the coupling part 314 with a downwardly depressed coupling groove 334.

Also, the mounting grooves 312 of the upper block case 310 are individually formed so as to correspond to the respective upper-row conductive sensors 322. The mounting groove 332 of the lower block case 330 is configured in the form of a single groove in which all of the lower-row conductive sensors 324 are mounted.

The upper block case 310 and the lower block case 330 are provided at the fronts thereof with depressions 318 and 338 in which middle portions of wires 326 and 328 are mounted. A plurality of protrusions 316 and 336 is formed at the insides of the depressions 318 and 338 in an alternately oriented fashion to stably fix the middle portions of the inserted wires 326 and 328 so that the middle portions of the inserted wires 326 and 328 cannot be dislocated.

Meanwhile, the conductive sensors 322 and 324 are formed to have a receptacle type structure in which the conductive sensors 322 and 324 are inserted into the electrode terminal connection parts 406 and 404 of the battery cells from above. The conductive sensors 322 and 324 are connected to the connector 340 via the wires 326 and 328. Each of the wires 326 and 328 is wrapped with an insulating tape or is mounted in an insulative pipe 320 so that each of the wires 326 and 328 can be isolated from the outside.

The upper-row conductive sensors 322 are connected to the upper-row electrode terminal connection parts 406 in a state in which the upper-row conductive sensors 322 are mounted in the mounting grooves 312 of the upper block case 310. The lower-row conductive sensors 324 are connected to the lower-row electrode terminal connection parts 404 in a state in which the lower-row conductive sensors 322 are mounted in the mounting groove 332 of the lower block case 330.

Figure 5:
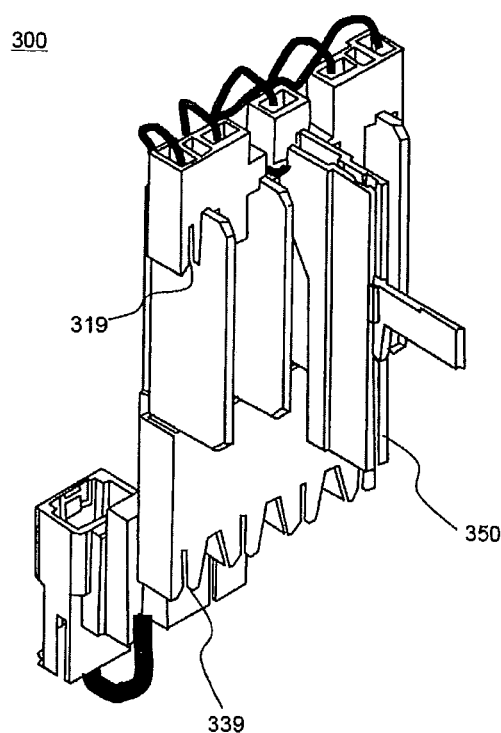
FIG. 5 is a typical rear view of the voltage sensing assembly of FIG. 3.

FIG. 5 is a typical rear view of the voltage sensing assembly of FIG. 3.

Referring to FIG. 5 together with FIGS. 4 and 7, the conductive sensors 322 and 324, which are fixed in a state in which the conductive sensors 322 and 324 are fitted in the mounting grooves 312 and 332 of the upper block case 310 and the lower block case 330, are connected to the electrode terminal connection parts 404 through rear openings 319 and 339 of the upper block case 310 and the lower block case 330.

Also, a coupling member 350, configured to be mounted to an upper case 500 (see FIG. 7) of the battery module 900 (see FIG. 7), protrudes from the rear of the voltage sensing assembly 300 and the upper case 500 of the battery module 900 is provided at the front thereof with a coupling groove 506 corresponding to the coupling member 350. The coupling groove may be formed at a lower case 600 of the battery module 900.

Figure 6:
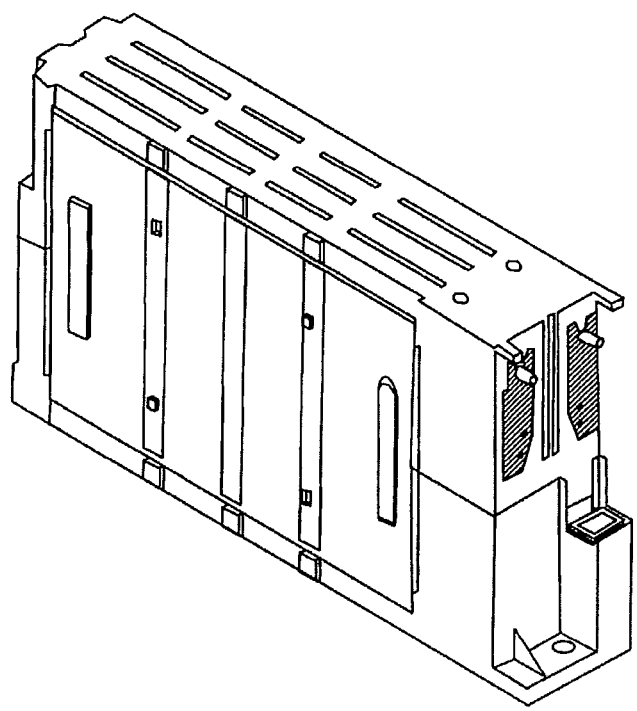
FIG. 6 is a perspective view of a battery module according to an embodiment of the present invention.

FIG. 6 is a perspective view typically illustrating a battery module according to an embodiment of the present invention, and FIG. 7 is a typical exploded view of the battery module of FIG. 6.

Referring to these drawings, the battery module 900 includes a battery cell stack 400 having a plurality of unit modules 409 connected in series to each other in a state in which the unit modules 408 are stacked in the lateral direction, an upper case 500, in which the upper part of the voltage sensing assembly 300 is mounted, and a lower case 600, in which the lower part of the voltage sensing assembly 300 is mounted.

Also, bus bars 402 to connect the electrode terminals of the battery cells to external input and output terminals are mounted at the front of the battery cell stack 400.

The upper case 500 covers the end of one side of the battery cell stack 400 and portions of the top and bottom of the battery cell stack 400. The upper case 500 is provided at the front thereof with external input and output terminals 502 and a pair of slits 504, through which the bus bars 402 connected to the outermost electrode terminals of the battery cell stack are inserted. The lower case 600 is coupled to the upper case 500 in a state in which the lower case 600 covers the end of the other side of the battery cell stack 400 and portions of the top and bottom of the battery cell stack 400.

The voltage sensing assembly 300 is mounted inside the front of the upper case 500 and the lower case 600 which are coupled to each other.

Figure 8:
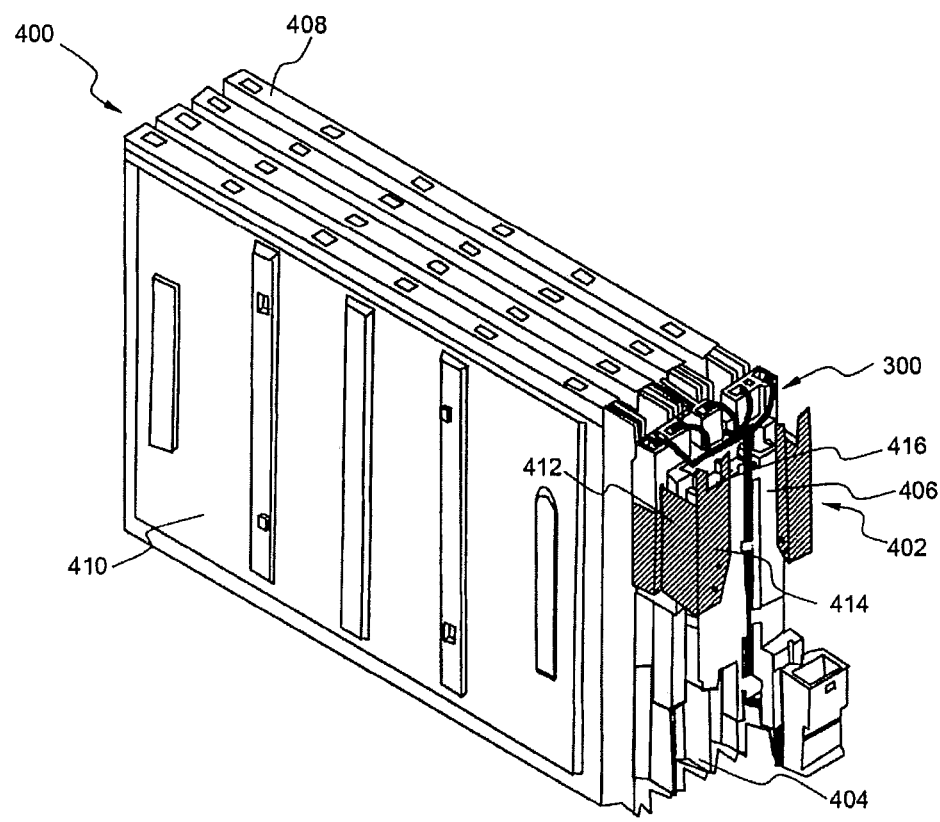
FIG. 8 is a perspective view of a structure of the battery module of FIG. 6 excluding an upper case and a lower case.

FIG. 8 is a perspective view typically illustrating a structure of the battery module of FIG. 6 excluding the upper case and the lower case.

Referring to FIG. 8 together with FIG. 7, the battery cell stack 400 includes four unit modules 408 including plate-shaped battery cells, each of which has electrode terminals formed at the upper end thereof.

Each of the unit modules 408 includes two battery cells arranged in a stacked structure in a state in which electrode terminals of the battery cells are connected in series to each other and a pair of cell covers 410 coupled to each other so as to cover the entirety of the outside of the battery cell stack excluding the electrode terminals of the battery cells.

Each of the bus bars 402 includes an electrode terminal connection part 412 electrically connected to a corresponding one of the outermost electrode terminals of the battery module and an input and output terminal connection part 414 electrically connected to a corresponding one of the external input and output terminals 502 of the upper case 500. The input and output terminal connection part 414 is perpendicularly bent from the electrode terminal connection part 412 inwardly of the battery module 400.

Also, the input and output terminal connection part 414 is provided at the upper part thereof with an inwardly depressed region 416. Each of the external input and output terminals 502 is fitted in the depressed region 416 of a corresponding one of the input and output terminal connection parts 414, thereby achieving electrical connection between each of the external input and output terminals 502 and a corresponding one of the bus bars 402.

Figure 9:
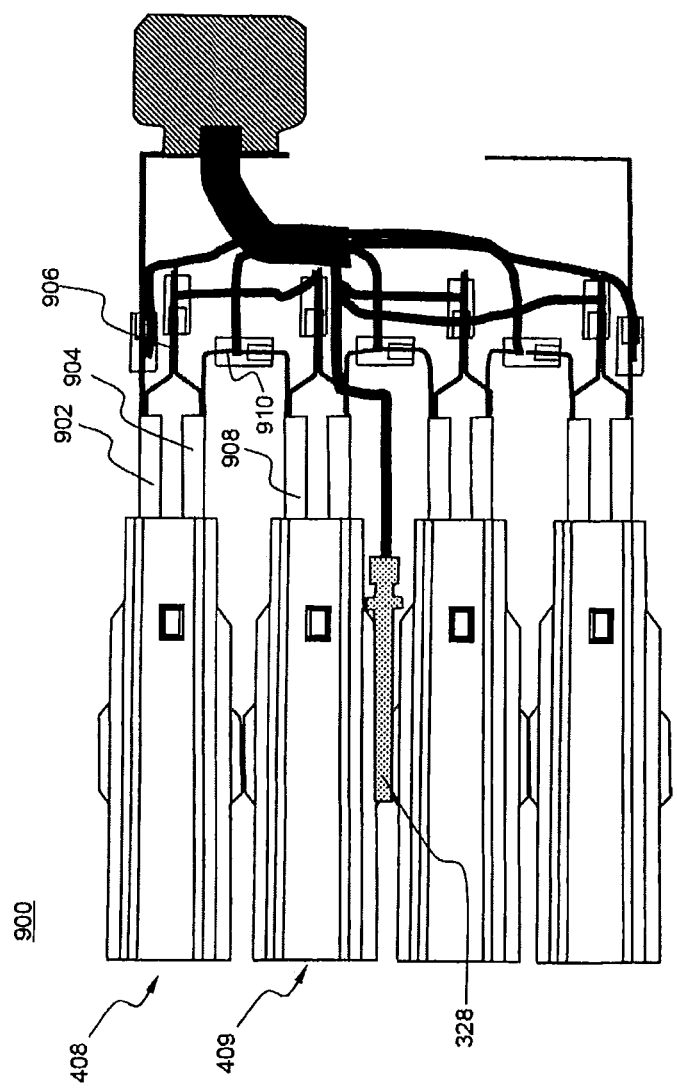
FIG. 9 is a typical plan view of the battery module of FIG. 8.
Figure 10:
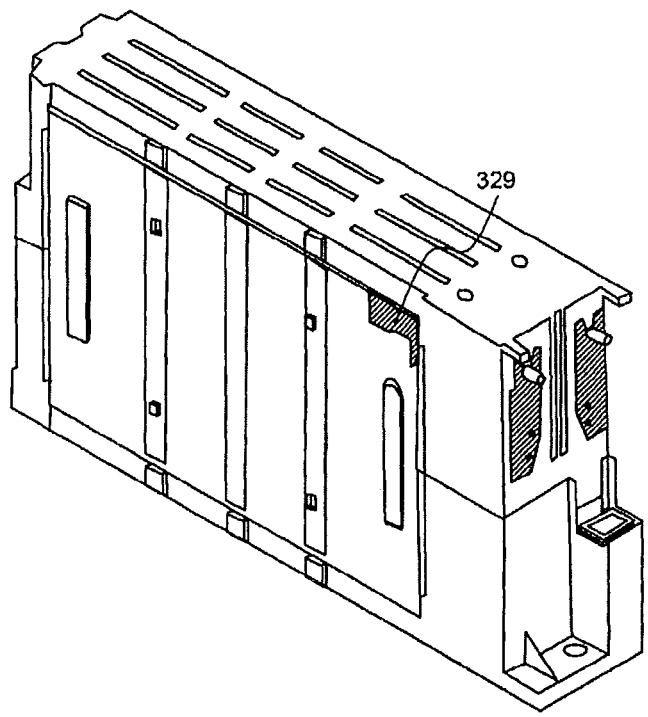
FIG. 10 is a perspective view of a battery module according to another embodiment of the present invention.

FIG. 9 is a typical plan view of the battery module of FIG. 8, and FIG. 10 is a perspective view typically illustrating a battery module according to another embodiment of the present invention.

Referring first to FIG. 9, a battery cell temperature sensor 328 to sense temperatures of battery cells is located at the middle region of the battery module 900.

Also, electrode terminals 902 and 904, which are connected in series to each other, of battery cells disposed adjacent to each other in a unit module 408 are disposed in tight contact with each other in a state in which the electrode terminals face each other to constitute an electrode terminal connection part 906. Furthermore, electrode terminals 904 and 908 of battery cells disposed in different unit modules 408 and 409 are connected in series to each other so that the battery cells adjacent to each other are disposed in tight contact with each other in a state in which the electrode terminals 904 and 908 are perpendicularly bent to constitute a perpendicular electrode terminal connection part 910.

Referring now to FIG. 10, a coolant temperature sensor 329 to measure the temperature of a coolant in a coolant introduction part is disposed at an outermost side of a battery module 902.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A voltage sensing assembly for a battery module to sense voltage of battery cells having electrode terminals formed at the upper end or the lower end thereof in a state in which the voltage sensing assembly is mounted in the battery module, the voltage sensing assembly comprising:
   (a) an upper block case and a lower block case to be coupled to each other in an assembled fashion, the upper block case and the lower block case being made of an electrically insulative material, the upper block case and the lower block case being mounted to a region (front or rear) of the battery module corresponding to electrode terminal connection parts of the battery cells;
   (b) upper-row and lower-row conductive sensors to be connected to the electrode terminal connection parts of the battery cells, respectively; and
   (c) a connector to transmit voltages sensed by the conductive sensors to a battery management system (BMS), wherein
   the upper block case and the lower block case comprise mounting grooves, which are upwardly open, formed at positions corresponding to the electrode terminal connection parts, respectively, the upper-row conductive sensors are connected to the upper-row electrode terminal connection parts in a state in which the upper-row conductive sensors are mounted in the mounting grooves of the upper block case, and the lower-row conductive sensors are connected to the lower-row electrode terminal connection parts in a state in which the lower-row conductive sensors are mounted in the mounting groove of the lower block case.

2. The voltage sensing assembly according to claim 1, wherein the upper block case is provided at one side of the outside thereof with a downwardly protruding coupling part, and the lower block case is provided at the outside thereof corresponding to the coupling part with a downwardly depressed coupling groove.

3. The voltage sensing assembly according to claim 1, wherein the mounting grooves of the upper block case are individually formed so as to correspond to the respective upper-row conductive sensors.

4. The voltage sensing assembly according to claim 1, wherein the mounting groove of the lower block case is configured in the form of a single groove in which all of the lower-row conductive sensors are mounted.

5. The voltage sensing assembly according to claim 1, wherein the mounting grooves of the upper block case and the lower block case are upwardly depressed at regions facing the electrode terminal connection parts.

6. The voltage sensing assembly according to claim 1, wherein the conductive sensors are formed to have a receptacle type structure in which the conductive sensors are inserted into the electrode terminal connection parts from above.

7. The voltage sensing assembly according to claim 1, wherein the conductive sensors are connected to the connector via wires and each of the wires is wrapped with an insulating tape or is mounted in a tubular member so that each of the wires can be isolated from the outside.

8. The voltage sensing assembly according to claim 7, wherein the upper block case and the lower block case are provided at the fronts thereof with depressions in which the respective wires are mounted, and each of the depressions is provided at the inside thereof with a plurality of protrusions formed in an alternately oriented fashion to stably fix a corresponding one of the inserted wires.

9. The voltage sensing assembly according to claim 1, further comprising a battery cell temperature sensor to sense temperatures of the battery cells and/or a coolant temperature sensor to measure temperature of a coolant in a coolant introduction part.

10. A battery module having a voltage sensing assembly according to claim 1.

11. The battery module according to claim 10, comprising:
(a) a battery cell stack having a plurality of battery cells or unit modules connected in series to each other in a state in which the battery cells or unit modules are stacked in the lateral direction, the battery cell stack being provided at the front thereof with bus bars to connect electrode terminals of the battery cells to external input and output terminals;
(b) an upper case to cover the end of one side of the battery cell stack and portions of the top and bottom of the battery cell stack, the upper case being provided at the front thereof with external input and output terminals, the upper part of the voltage sensing assembly being mounted in the upper case; and
(c) a lower case coupled to the upper case in a state in which the lower case covers the end of the other side of the battery cell stack and the remaining portions of the top and bottom of the battery cell stack, the lower part of the voltage sensing assembly being mounted in the lower case.

12. The battery module according to claim 11, wherein the voltage sensing assembly is mounted inside the front of the upper case and the lower case which are coupled to each other.

13. The battery module according to claim 11, wherein the battery cell stack comprises a plurality of unit modules comprising plate-shaped battery cells, each of which has electrode terminals formed at the upper end or the lower end thereof, and each of the unit modules comprises two or more battery cells arranged in a stacked structure in a state in which electrode terminals of the battery cells are connected in series to each other and a pair of cell covers coupled to each other so as to cover the entirety of the outside of the battery cell stack excluding the electrode terminals of the battery cells.

14. The battery module according to claim 13, wherein electrode terminals, which are connected in series to each other, of battery cells disposed adjacent to each other in a unit module are disposed in tight contact with each other in a state in which the electrode terminals face each other to constitute an electrode terminal connection part.

15. The battery module according to claim 13, wherein electrode terminals, which are connected in series to each other, of battery cells disposed in different unit modules so that the battery cells are adjacent to each other are disposed in tight contact with each other in a state in which the electrode terminals are perpendicularly bent to constitute a perpendicular electrode terminal connection part.

16. The battery module according to claim 11, wherein the upper case is provided at the front thereof with a pair of slits, through which the bus bars connected to the outermost electrode terminals of the battery cell stack are inserted.

17. The battery module according to claim 11, wherein each of the bus bars comprises an electrode terminal connection part electrically connected to a corresponding one of the outermost electrode terminals of the battery module and an input and output terminal connection part connected to a corresponding one of the external input and output terminals of the upper case, the input and output terminal connection part being perpendicularly bent from the electrode terminal connection part inwardly of the battery module.

18. The battery module according to claim 17, wherein the input and output terminal connection part is provided at the upper part thereof with an inwardly depressed region, and each of the external input and output terminals is fitted in the depressed region, thereby achieving electrical connection between each of the external input and output terminals and a corresponding one of the bus bars.

19. The battery module according to claim 11, further comprising a battery cell temperature sensor, wherein the battery cell temperature sensor is located at the middle region of the battery module.

20. The battery module according to claim 11, further comprising a coolant temperature sensor, wherein the coolant temperature sensor is located at an outermost side of the battery module.

21. A battery pack manufactured using a battery module according to claim 11 as a unit module.

22. The battery pack according to claim 21, wherein the battery pack is used as a power source for electric vehicles, hybrid electric vehicles or plug-in hybrid electric vehicles.

* * * * *